US008351239B2

(12) United States Patent
Kim et al.

(10) Patent No.: US 8,351,239 B2
(45) Date of Patent: Jan. 8, 2013

(54) DYNAMIC SENSE CURRENT SUPPLY CIRCUIT AND ASSOCIATED METHOD FOR READING AND CHARACTERIZING A RESISTIVE MEMORY ARRAY

(75) Inventors: Young W. Kim, San Jose, CA (US); Glen Rosendale, Palo Alto, CA (US)

(73) Assignee: Nantero Inc., Woburn, MA (US)

( * ) Notice: Subject to any disclaimer, the term of this patent is extended or adjusted under 35 U.S.C. 154(b) by 547 days.

(21) Appl. No.: 12/604,915

(22) Filed: Oct. 23, 2009

(65) Prior Publication Data
US 2011/0096587 A1  Apr. 28, 2011

(51) Int. Cl.
*G11C 11/00* (2006.01)
(52) U.S. Cl. ............................ 365/148; 365/207; 365/226
(58) Field of Classification Search .................. 365/148, 365/207, 226, 163, 185.13, 185.21, 189.07, 365/203, 189.05, 105, 189.09, 103, 206
See application file for complete search history.

(56) References Cited

U.S. PATENT DOCUMENTS

| | | | |
|---|---|---|---|
| 5,926,422 A | 7/1999 | Haukness | |
| 6,057,637 A | 5/2000 | Zettl et al. | |
| 6,128,214 A | 10/2000 | Kuekes et al. | |
| 6,256,767 B1 | 7/2001 | Kuekes et al. | |
| 6,277,318 B1 | 8/2001 | Bower et al. | |
| 6,314,019 B1 | 11/2001 | Kuekes et al. | |
| 6,342,276 B1 | 1/2002 | You | |
| 6,409,567 B1 | 6/2002 | Amey, Jr. et al. | |
| 6,423,583 B1 | 7/2002 | Avouris et al. | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,548,841 B2 | 4/2003 | Frazier et al. | |
| 6,630,772 B1 | 10/2003 | Bower et al. | |
| 6,645,628 B2 | 11/2003 | Shiffler, Jr. et al. | |
| 6,704,233 B2 | 3/2004 | Conte et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |
| 6,803,840 B2 | 10/2004 | Hunt et al. | |

(Continued)

FOREIGN PATENT DOCUMENTS

GB        2 364 933 A        2/2002

(Continued)

OTHER PUBLICATIONS

Ago et al., "Workfunction of Purified and Oxidised Carbon Nanotubes," Synthetic Metals, vol. 103, pp. 2494-2495, 1999.

(Continued)

*Primary Examiner* — Dang Nguyen
(74) *Attorney, Agent, or Firm* — Nantero Inc.

(57) ABSTRACT

A dynamic sense current supply circuit and an associated method for rapidly characterizing a resistive memory array is disclosed. In one embodiment, the disclosed circuit comprises a first and second dynamically programmable current mirror sub-circuit. Responsive to a bank of control signals, each dynamically programmable current mirror sub-circuit provides a dynamically adjustable current scaling factor. These scaling factors are used to scale a supplied reference current to generate a plurality of sense currents which can be used within a plurality of read operations on a resistive memory array. A digital circuit is also provided to sense and store the result of each read operation.

14 Claims, 8 Drawing Sheets

U.S. PATENT DOCUMENTS

| | | | |
|---|---|---|---|
| 6,808,746 | B1 | 10/2004 | Dai et al. |
| 6,809,465 | B2 | 10/2004 | Jin |
| 6,833,558 | B2 | 12/2004 | Lee et al. |
| 6,835,591 | B2 | 12/2004 | Rueckes et al. |
| 6,858,197 | B1 | 2/2005 | Delzeit |
| 6,863,942 | B2 | 3/2005 | Ren et al. |
| 6,899,945 | B2 | 5/2005 | Smalley et al. |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 6,990,009 | B2 | 1/2006 | Bertin et al. |
| 6,999,340 | B2 | 2/2006 | Shimizu |
| 7,015,500 | B2 | 3/2006 | Choi et al. |
| 7,057,402 | B2 | 6/2006 | Cole et al. |
| 7,068,065 | B1 * | 6/2006 | Nasrullah ................ 326/30 |
| 7,106,644 | B2 | 9/2006 | Chou |
| 7,115,901 | B2 | 10/2006 | Bertin et al. |
| 7,115,960 | B2 | 10/2006 | Bertin et al. |
| 7,161,403 | B2 | 1/2007 | Bertin |
| 7,335,395 | B2 | 2/2008 | Ward et al. |
| 7,416,993 | B2 | 8/2008 | Segal et al. |
| 7,479,654 | B2 | 1/2009 | Bertin et al. |
| 7,566,478 | B2 | 7/2009 | Ward et al. |
| 7,781,862 | B2 | 8/2010 | Bertin et al. |
| 2001/0004979 | A1 | 6/2001 | Han et al. |
| 2001/0023986 | A1 | 9/2001 | Mancevski |
| 2002/0160111 | A1 | 10/2002 | Sun et al. |
| 2002/0175390 | A1 | 11/2002 | Goldstein et al. |
| 2003/0004058 | A1 | 1/2003 | Li et al. |
| 2003/0122111 | A1 | 7/2003 | Glatkowski |
| 2003/0177450 | A1 | 9/2003 | Nugent |
| 2003/0200521 | A1 | 10/2003 | DeHon et al. |
| 2004/0005723 | A1 | 1/2004 | Empedocles et al. |
| 2004/0007528 | A1 | 1/2004 | Bakajin et al. |
| 2004/0023253 | A1 | 2/2004 | Kunwar et al. |
| 2004/0031975 | A1 | 2/2004 | Kern et al. |
| 2004/0041154 | A1 | 3/2004 | Watanabe et al. |
| 2004/0043527 | A1 | 3/2004 | Bradley et al. |
| 2004/0071949 | A1 | 4/2004 | Glatkowski et al. |
| 2004/0099438 | A1 | 5/2004 | Arthur et al. |
| 2004/0104129 | A1 | 6/2004 | Gu et al. |
| 2004/0181630 | A1 | 9/2004 | Jaiprakash et al. |
| 2004/0253167 | A1 | 12/2004 | Silva et al. |
| 2004/0265550 | A1 | 12/2004 | Glatkowski et al. |
| 2005/0053525 | A1 | 3/2005 | Segal et al. |
| 2005/0056877 | A1 | 3/2005 | Rueckes et al. |
| 2005/0058797 | A1 | 3/2005 | Sen et al. |
| 2005/0095938 | A1 | 5/2005 | Rosenberger et al. |
| 2006/0237537 | A1 | 10/2006 | Empedocles et al. |
| 2007/0004191 | A1 | 1/2007 | Gu et al. |
| 2008/0074182 | A1 * | 3/2008 | Hoelzle et al. ................ 330/2 |
| 2008/0158936 | A1 | 7/2008 | Bertin et al. |
| 2008/0170429 | A1 | 7/2008 | Bertin et al. |

FOREIGN PATENT DOCUMENTS

| | | |
|---|---|---|
| JP | 2000/203821 | 7/2000 |
| JP | 2001/035362 A2 | 2/2001 |
| JP | 2004/090208 A2 | 3/2004 |
| WO | WO-98/39250 A1 | 9/1998 |
| WO | WO-99/65821 A1 | 12/1999 |
| WO | WO-00/48195 | 8/2000 |
| WO | WO-01/03208 | 1/2001 |
| WO | WO-02/45113 A1 | 6/2002 |
| WO | WO-02/48701 A2 | 6/2002 |
| WO | WO-03/016901 A1 | 2/2003 |
| WO | WO-03/034142 A1 | 4/2003 |

OTHER PUBLICATIONS

Ajayan, P. M. et al., "Applications of Carbon Nanotubes", Carbon Nanotubes, vol. 80, pp. 391-425, 2001.

Avouris, P., et al., "Carbon Nanotube Electronics," Chemical Physics, 2002, vol. 284, pp. 429-445.

Bachtold, A., et al, "Logic Circuits Based on Carbon Nanotubes," Physica, 2003, pp. 42-46.

Banerjee et al., "Functionalization of Carbon Nanotubes with a Metal-Containing Molecular Complex," Nano Letters, vol. 2, No. 1, pp. 49-53, 2002.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen et al., "Heterogeneous Single-Walled Carbon Nanotube Catalyst Discovery and Optimization," Chem. Mater, vol. 14, pp. 1891-1896, 2002.

Chen, J. et al., "Self-aligned Carbon Nanotube Transistors with Novel Chemical Doping", IEDM, pp. 29.4.1-29.4.4, 2004.

Chen, J., et al, "Self-aligned Carbon Nanotube Transistors with Charge Transfer Doping," Applied Physics Letters (2005) 86:123108-1-3.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Dai, H. et al., "Controlled Chemical Routes to Nanotube Artchitectures, Physics, and Devices", J. Phys. Chem. B, vol. 103, pp. 1126-11255, 1999.

Delzeit et al., "Multilayered metal catalysts for controlling the density of single-walled carbon nanotubes growth," Chemical Physics letters, vol. 348, pp. 368-374, Nov. 16, 2001.

Derycke, V. et al., "Controlling doping and carrier injection in carbon nanotube transistors", Applied Physics Letters, vol. 80, No. 15, pp. 2773-2775, Apr. 15, 2002.

Derycke, V., et al., "Carbon Nanotube Inter- and Intramolecular Logic Gates," Nano Letters, Sep. 2001, vol. 1, No. 9, pp. 453-456.

Desai et al., "Freestanding Carbon Nanotube Specific Fabrication", *Proc. of 2005, 5th IEEE Conf., Nanotech*, Nagoya, Japan, pp. 1-4, Jul. 2005.

Duan, X. et al., "Nonvolatile Memory and Programmable Logic from Molecule-Gated Nanowires", *Nano Letters*, vol. 0, No. 0, pp. A-D, 2002.

Franklin, N. R. et al., "An Enhanced CVD Approach to Extensive Nanotube Networks with Directionality", Advanced Materials, 5 pages, 2000.

Haddon et al.,"Purification and Separation of Carbon Nanotubes," *MRS Bulletin*, pp. 252-259, Apr. 2004.

Hafner, J. H. et al., "Catalytic growth of single-wall carbon nanotubes from metal particles", Chemical Physics Letters, vol. 296, pp. 195-202, Oct. 30, 1998.

Heinze, S. et al., "Carbon Nanotubes as Schottky Barrier Transistsors", *Physical Review Letters*, vol. 89, No. 10, pp. 16801-1-106801-4, 2002.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-L91, 2002.

Huang, Y., et al, "Logic Gates and Computation from Assembled Nanowire Building Blocks," Science, 2001, 294(9):1313-1317.

International Search Authority, International Search Report for PCT/US2005/045316 mailed Sep. 6, 2006, 2 pages.

International Search Report and Written Opinion for International Patent Application PCT/US05/18467, mailed Oct. 1, 2007.

International Search Report, International Searching Authority, for International Application PCT/US05/18539, mailed Sep. 18, 2006, 4 pages.

Javey, A. et al., "Carbon Nanotube Field-Effect Transistors with Integrated Ohmic Contacts and High-k Gate Dielectrics", Nano Letters, vol. 4, No. 3, pp. 447-450, 2004.

Javey, A. et al., "High-k dielectrics for advanced carbon-nanotube transistors and logic gates", Nature Materials, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2, No. 9, pp. 929-932.

Jeong et al., "A new purification method of single-wall carbon nanotubes using H2S and O2 mixture gas," Chemical Physics Letters, vol. 344, pp. 18-22, Aug. 17, 2001.

Joselevich, E., "Vectorial Growth of Metallic and Semiconducting Single-Wall Carbon Nanotubes", Nano Letters, vol. 0, No. 0, A-E, 2002.

Kahn, et al., "Solubilization of Oxidized Single-Walled Carbon Nanotubes in Organic and Aqueous Solvents through Organic Derivatization," Nano Letters, 2002, vol. 2, No. 11, 1215-1218, 4 pages.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe—Mo Nanoparticles as the Catalyst for CVD Synthesis of Carbon Nanotubes", Chem. Mater., vol. 13. pp. 1008-1014, 2001.

Lin, Y., et al, "Novel Carbon Nanotube FET Design with Tunable Polarity," IEDM (2004) 4:687-690.

Martel, R., et al, "Carbon Nanotube Field-Effect Transistors and Logic Circuits," *DAC 2002*, Jun. 10-12, 2002, vol. 7.4, pp. 94-98.

Nerushev, O. A., et al., "Carbon nanotube films obtained by thermal chemical vapour deposition", J. Mater. Chem., vol. 11, pp. 1122-1132, 2001.

Niu, C. et al., "High power electrochemical capacitors based on carbon nanotube electrodes," Appl. Phys. Lett. 70(11), Mar. 17, 1997, pp. 1480-1482.

Onoa et al., "Bulk Production of singly dispersed carbon nanotubes with prescriped lengths", *Nanotechnology*, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett*. 2003, vol. 3(3), pp. 347-351.

Radosavljevic, M. et al., "Nonvolatile Molecular Memory Elements Based on Ambipolar Nanotube Field Effect Transistors", *Nano Letters*, vol. 2, No. 7, pp. 761-764, 2002.

Rueckes, et al., "Carbon nanotube-based nonvolatile random access memory for molecular computing", *Science*, vol. 289, pp. 94-97, Jul. 7, 2000.

Shelimov et al., "Purification of single-wall carbon nanotubes by ultrasonically assisted filtration," Chemical Physics Letters, vol. 282, pp. 429-434, Jan. 23, 1998.

Sotiropoulou, S. et al., "Carbon nanotube array-based biosensor", Anal. Bioanal. Chem, vol. 375, pp. 103-105, 2003.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", Applied Physics Letters, vol. 80, No. 20, pp. 3817-3819, May 20, 2002.

Zhang et al., "Formation of metal nanowires on suspened signel-walled carbon nanotubes", *Appl. Phys. Lett*., vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

* cited by examiner

| SEL101 | SEL102 | SEL103 | Scale Factor "A" |
|---|---|---|---|
| 1 | 1 | 1 | 1 |
| 0 | 1 | 1 | 2 |
| 0 | 0 | 1 | 3 |
| 0 | 0 | 0 | 4 |

FIG. 2A

| SEL104 | SEL105 | SEL106 | Scale Factor "B" |
|---|---|---|---|
| 1 | 1 | 1 | 1 |
| 0 | 1 | 1 | 2 |
| 0 | 0 | 1 | 3 |
| 0 | 0 | 0 | 4 |

FIG. 2B

| CONFIGURATION SETTING | SCALE FACTOR "A" | SCALE FACTOR "B" | MEMORY CELL CURRENT |
|---|---|---|---|
| #1 | 1 | 4 | IREF × 0.25 |
| #2 | 1 | 3 | IREF × 0.334 |
| #3 | 1 | 2 | IREF × 0.5 |
| #4 | 2 | 3 | IREF × 0.667 |
| #5 | 3 | 4 | IREF × 0.75 |
| #6 | 1 | 1 | IREF |
| #7 | 4 | 3 | IREF × 1.334 |
| #8 | 3 | 2 | IREF × 1.5 |
| #9 | 2 | 1 | IREF × 2 |
| #10 | 3 | 1 | IREF × 3 |
| #11 | 4 | 1 | IREF × 4 |

FIG. 2C

| SEL401 | SEL402 | SCALE FACTOR "A" |
|---|---|---|
| 0 | 1 | 1 |
| 1 | 0 | 2 |
| 0 | 0 | 3 |

FIG. 5A

| SEL403 | SEL404 | SCALE FACTOR "B" |
|---|---|---|
| 0 | 1 | 0.5 |
| 1 | 0 | 2.5 |
| 0 | 0 | 3 |

FIG. 5B

| CONFIGURATION SETTING | SCALE FACTOR "A" | SCALE FACTOR "B" | MEMORY CELL CURRENT |
|---|---|---|---|
| #1 | 1 | 3 | IREF × 0.334 |
| #2 | 1 | 2.5 | IREF × 0.4 |
| #3 | 2 | 3 | IREF × 0.667 |
| #4 | 2 | 2.5 | IREF × 0.8 |
| #5 | 3 | 3 | IREF |
| #6 | 3 | 2.5 | IREF × 1.2 |
| #7 | 1 | 0.5 | IREF × 2 |
| #8 | 2 | 0.5 | IREF × 4 |
| #9 | 3 | 0.5 | IREF × 6 |

FIG. 5C

DYNAMIC SENSE CURRENT SUPPLY CIRCUIT AND ASSOCIATED METHOD FOR READING AND CHARACTERIZING A RESISTIVE MEMORY ARRAY

CROSS-REFERENCE TO RELATED APPLICATIONS

This application is related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Patterned Nanowire Articles on a Substrate and Methods of Making Same (U.S. Pat. No. 7,416,993), filed Sep. 8, 2004; and Memory Arrays Using Nanotube Articles with Reprogrammable Resistance (U.S. Pat. No. 7,479,654), filed Nov. 15, 2005.

This application is related to the following patent applications, which are assigned to the assignee of the application, and are hereby incorporated by reference in their entirety:

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Two-Terminal Nanotube Devices and Systems and Methods of Making Same (U.S. patent application Ser. No. 11/280,786), filed Nov. 15, 2005;

Nonvolatile Nanotube Diodes and Nonvolatile Nanotube Blocks and Systems Using Same and Methods of Making Same (U.S. patent application Ser. No. 11/835,856), filed Aug. 8, 2007; and Nonvolatile Resistive Memories having Scalable Two-Terminal Nanotube Switches (U.S. patent application Ser. No. 11/835,612), filed Aug. 8, 2007.

BACKGROUND

1. Technical Field

The present application generally relates to memory arrays and more particularly to circuits and methods for sensing, reading, and characterizing memory arrays.

2. Discussion of Related Art

As memory arrays have increased in size and developed in complexity, fabrication challenges have arisen. Specifically, it has become increasingly important to test and/or qualify specific electrical characteristics and parameters associated with the individual memory cells in large memory arrays. For example, it is often important to test the electrical characteristics and parameters including, but not limited to, minimum write voltages, minimum and maximum read voltages/currents (depending on the memory cell technology employed), minimum data-retention voltages (within volatile memory circuits), minimum data-retention times (within non-volatile memory technologies), and electrical noise tolerances. Each can be useful in gauging the performance of the individual memory cells and identifying faults and defects. Further, as the state of the art drives memory array circuits into increasingly complex structures—increasing memory array dimensions (the number of memory cells within an array) and decreasing physical dimensions of individual memory cells—the need to accurately and completely characterize such circuits becomes increasingly critical to optimizing the design and the long term reliability of such structures.

Resistive memory arrays have taken many forms. For example, carbon nanotube memory arrays disclosed by Bertin et al. in U.S. patent application Ser. No. 11/280,786, filed Nov. 15, 2005, entitled "Two-Terminal Nanotube Devices and Systems and Methods of Making Same" and, more particularly, carbon nanotube block memory arrays disclosed by Bertin et al., in U.S. patent application Ser. No. 11/835,856, entitled "Nonvolatile Nanotube Diodes and Nonvolatile Nanotube Blocks and Systems Using Same and Methods of Making Same" are comprised of multiple cells which can each be set (programmed) to a plurality of nonvolatile resistive states. Each aforementioned reference is herein incorporated by reference in its entirety. In other examples, resistive memory arrays can take the form of magneto-resistive memory arrays such as is disclosed in U.S. Pat. No. 6,999,340 to Shimizu. As disclosed in the aforementioned references, the memory cells can be set to a plurality of non-volatile resistive states and thus can be used to encode digital information. For example, a high resistive state can be used to indicate a digital "1" (or high) and a low resistive state can be used to indicate a digital "0" (or low). In a typical read operation, a sense current (sometimes referred to as a "read current" by those skilled in the art) is applied to a memory cell and the resulting voltage used to determine the resistive state of the cell.

A key parameter in resistive memory array circuits is the device's responsiveness to a given range of sense currents. In a typical sense current characterization operation, each cell within the memory array is written with a test value. Various electrical currents are then supplied to each memory cell within the memory array, and the resulting voltages analyzed to determine if the expected value was successfully read by each of the plurality of applied sense currents. In this way, the effectiveness of different sense currents can be characterized for the entire memory array.

While such a sense current characterization operation is effective in providing test information with regard to the effectiveness of different sense current values, such an operation can be limiting with respect to processing time. Characterizing a very large memory array with a significantly large set of sense current values (as is becoming increasingly common and necessary as the state of the art within nonvolatile memory devices advances) can become unacceptably costly and time consuming. To this end, a plurality of improved characterization and test methods have been proposed.

U.S. Pat. No. 7,106,644 to Chou teaches an improved circuit and associated test method for performing a burn in test on a memory array. A plurality of current limiting circuits are used to limit the current through each word line during the burn-in test, thus allowing a test voltage to sufficiently stress a plurality of word lines simultaneously.

U.S. Pat. No. 6,704,233 to Conte et al. teaches a circuit and associated method for reading a memory cell within a memory array. The circuit of Conte et al. comprises a reference memory cell, a current supply, a pair of transimpedance amplifiers, and a comparator. In the corresponding method Conte et al. generates and then passes a sense (read) current through both the memory cell under test and the reference memory cell, converting the currents through the memory cell under test and the reference memory cell to voltages (via the transimpedance amplifiers). Finally, the resulting voltages can be compared to obtain a digital representation of the bit stored in the memory cell under test.

U.S. Pat. No. 5,926,422 to Haukness teaches a circuit and associated method for rapidly testing a large memory array. A plurality of memory cells are sensed by a circuit which reports a digital value (a "high" or a "low") indicating if all of the bits stored within said plurality of memory cells are of the same value. That is, Haukness' method significantly reduces the time required to verify a memory array by verifying the data state of a plurality of individual memory cells simultaneously.

While these methods reduce the amount of test time required within a characterization operation, they fail to provide the detailed test data obtained through a more traditional "brute force" sense current characterization operation.

Any discussion of the related art above and throughout this specification should in no way be considered as an admission that such art is widely known or forms part of the common general knowledge in the field.

SUMMARY OF THE DISCLOSURE

It is the object of the present disclosure to overcome the limitations associated with prior art. This is attained through the dynamic sense current supply circuit of the present disclosure and its associated characterization method.

In particular, an electronic circuit for characterizing a resistive memory array is described. This circuit includes a first current mirror sub-circuit, the first current mirror sub-circuit including a first stage and a second stage, the second stage including at least two current branches and wherein at least one of the current branches is responsive to an enable control. The circuit further includes a second current mirror sub-circuit, the second current mirror sub-circuit including a first stage and a second stage, the second stage including at least two current branches and wherein at least one of the current branches is responsive to an enable control. The circuit further includes an interconnection to couple a current generated within the first current mirror sub-circuit to the second current mirror sub-circuit. The circuit further includes a reference current terminal to apply an external reference current to the first current mirror sub-circuit. The circuit further includes a sense current terminal to apply a sense current generated through the second current mirror sub-circuit to a memory cell under test. The circuit further includes a digital circuit element to generate a digital signal indicative of a magnitude of a current flowing through at least one stage of the second current mirror sub-circuit.

The present disclosure also provides a method for characterizing a resistive memory array, the memory array including a plurality of memory cells. The method includes the steps of first electrically coupling a dynamic sense current supply circuit to a first memory cell within the memory array, then generating a first sense current through the dynamic sense current supply circuit to perform a read operation, then recording the result of the read operation, then repeating the steps of generating and recording for a predetermined range of sense currents, then electrically coupling to a second memory cell within the memory array and repeating the steps of generating and recording for a predetermined range of sense currents, and then further repeating the steps of electrically coupling, generating, and recording such that a desired plurality of memory cells within the resistive memory array are characterized.

In one aspect of the present disclosure, the dynamic sense current supply circuit of the present disclosure includes two programmable current mirror circuits. Each of the programmable current mirror circuits further includes a plurality of second stage branches responsive to external control signals. By selectively enabling and disabling the plurality of second stage branches, a dynamically controlled scaling factor is provided through each of the programmable current mirror circuits.

The programmable current mirror circuits are arranged to provide a scaled version of a "base" current—the "base" current supplied from a single current supply—to a resistive memory cell under test. By dynamically adjusting the scaling factors of the programmable current mirror circuits, a plurality of sense currents can be realized and provided to the resistive memory cell under test without connecting and disconnecting various current supplies or mechanically switching various circuit elements in and out.

In another aspect of the present disclosure, a first programmable current mirror is used to provide a first scaling factor and a second programmable current mirror is used to provide a second scaling factor.

In another aspect of the present disclosure, the programmable current mirror circuits are comprised of field effect transistors (FETs), the aspect ratios of which—that is, the ratio of the width of the gate to the length of the gate within the structure of the FET—are selected to provide desired scale factors through the programmable current mirror circuits.

In another aspect of the present disclosure, the dynamic sense current supply circuit further includes a method to sense the condition of a valid sense current through the circuit and provide a digital output signal representative of the condition.

In another aspect of the present disclosure, the dynamic sense current supply circuit of the present disclosure is used within a memory array characterization system. The system provides the sense currents generated within the dynamic sense current supply circuit to the plurality of individual memory cells within the memory array under test, allowing each of the individual memory cells to be rapidly tested with the plurality of sense currents provided by the dynamic sense current supply circuit.

Accordingly, it is the object of the present disclosure to provide a dynamic sense current supply circuit well suited to rapidly characterizing a large non-volatile resistive memory array.

It is also an object of the present disclosure that the circuit provide a range of sense currents to a memory cell under test, the sense currents dynamically selectable via one or more digital control lines.

It is further an object of the present disclosure that the circuit provide a digital output indicative of the state of the memory cell under test as read by the applied sense current.

It is also an object of the present disclosure to provide an associated characterization method which makes use of the dynamic sense current supply circuit of the present disclosure.

Other features and advantages of the present invention will become apparent from the following description of the invention which is provided below in relation to the accompanying drawings.

BRIEF DESCRIPTION OF THE DRAWINGS

FIGS. 2A-2C are tables detailing the selection bit configuration settings for the dynamic sense current supply circuit of FIG. 1, according to one or more embodiments of the present disclosure;

FIGS. 5A-5C are tables detailing the selection bit configuration settings for the dynamic sense current supply circuit of FIG. 4, according to one or more embodiments of the present disclosure;

DETAILED DESCRIPTION

The present disclosure provides a method for rapidly characterizing an array of resistive memory elements. As will be described in detail below, programmable current mirror circuits are used to scale a supplied reference current and then provide this scaled current to a resistive memory cell under test. The programmable current mirror circuits can include multiple branches which are responsive to external control signals. By enabling or disabling these current branches (through the use of these external control signals), the scaling factors through the programmable current mirror circuits can be dynamically set, allowing a plurality of different sense currents to be rapidly provided to the memory cell under test using a single source.

The methods of the present invention can also be used to read a multi-level resistive memory element. Multi-level resistive memory elements can store multiple bits of information in a single cell by providing more than two resistive states within that cell. For example, a resistive memory cell capable of storing four distinct resistive states would be capable of storing two binary bits of data (two bits corresponding to four distinct data values—bx00, bx01, bx10, and bx11). In some architecture schemes, reading multi-level resistive memory cells requires that a plurality of sense currents be employed. As such, the methods of the present disclosure (as well as the associated circuits) are well suited to rapidly read the sate of such cells.

Figure 1:
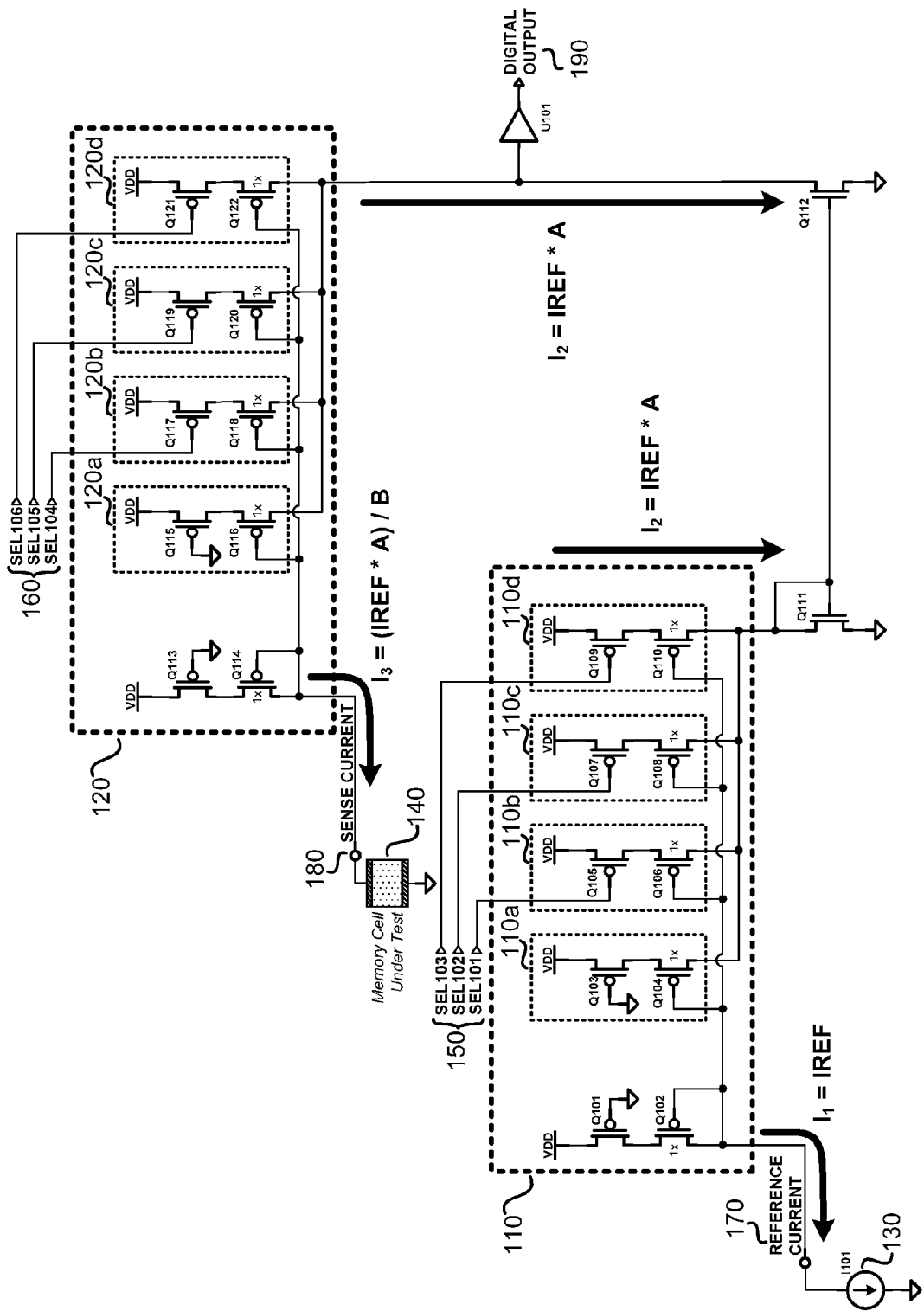
FIG. 1 is a simplified schematic diagram depicting a dynamic sense current supply circuit according to one or more embodiments.

FIG. 1 is a simplified schematic diagram illustrating an exemplary dynamic sense current supply circuit for characterizing and reading a resistive memory cell under test under the methods of the present disclosure. The dynamic sense current supply circuit illustrated in FIG. 1 has two subsections. A first programmable current mirror sub-circuit 110 is electrically interposed between a reference node 170 and a digital output node 190. A second mirror sub-circuit 120 is electrically interposed between the memory cell under test 140 and the digital output node 190. The first programmable current mirror sub-circuit 110 provides scaling factor A to reference current $I_1$, resulting in intermediate current $I_2$. The second programmable current mirror sub-circuit 120 provides scaling factor 1/B to intermediate current $I_2$, resulting in sense current $I_3$. Specific values for these scaling factors are selected by enabling or disabling the different branches (110a-110d and 120a-120d) within each programmable current mirror (110 and 120, respectively). Operated together, they facilitate a dynamically programmable sense current for testing a resistive memory cell 140.

The first programmable current mirror sub-circuit 110 includes a first stage—the first stage including FETs Q101 and Q102—and a second stage. The second stage has several branches 110a, 110b, 110c, and 110d. Each of these branches (110a, 110b, 110c, and 110d) includes an enable FET (Q103, Q105, Q107, and Q109, respectively) and a main FET (Q104, Q106, Q108, and Q110, respectively). The gate of the enable FET Q103 within the first branch 110a is tied to ground, permanently enabling said first branch 110a. The gates of the enable FETs (Q105, Q107, and Q109) in the remaining branches (110b, 110c, and 110d, respectively) are responsive to a first bank of digital control signals 150 (SEL101, SEL102, and SEL103, respectively). The first bank of digital control signals 150 enable and disable the remaining branches (110b, 110c, and 110d) within the second stage of the programmable current mirror sub-circuit 110.

In some embodiments, the gate aspect ratio (that is, the ratio of the width of the gate to the length of the gate within the structure of the FET) of the main FET within each of the different branches of the second stage (Q104, Q106, Q108, and Q110) is substantially equal to the gate aspect ratio of the main FET within the first stage Q102. When multiple branches within the second stage of the first programmable current mirror sub-circuit 110 are enabled, the gate aspect ratios of the main FET within each of the enabled branches effectively combine, creating a gate aspect ratio mismatch between the first and second stages of the programmable current mirror sub-circuit 110. Such a mismatch provides a scale factor (denoted as "A" within the simplified schematic diagram of FIG. 1) to a current passed through the first programmable current mirror sub-circuit 110.

In FIG. 1, a reference current supply 130 provides a constant "base" current $I_1$ (equal to a current value of "IREF" within the simplified schematic diagram of FIG. 1) through the first stage of the programmable current mirror sub-circuit 110 (FETs Q101 and Q102). Responsive to this supplied "base" current, the programmable current mirror sub-circuit 110 provides a scaled version of $I_1$ through its second stage. This scaled current is denoted as $I_2$ and is substantially equal to the current value of "IREF" times the scale factor ("IREF*A"). As described above, the value of this first scale factor ("A") is directly proportional to the number of current branches enabled within—and thus the effective gate aspect ratio of—the second stage of the programmable current mirror sub-circuit 110. FIG. 2A provides a table of nominal values of this first scale factor ("A") for a plurality of control line 150 settings.

A fixed current mirror circuit (that is, a non-programmable current mirror circuit) is used to interconnect the first and second current mirror sub-circuits 110 and 120. The fixed current mirror circuit connection has two FETs, Q111 and Q112 and provides the scaled current $I_2$ to the second stage of a second programmable current mirror sub-circuit 120.

Second programmable current mirror sub-circuit 120—identical in function to the first programmable current mirror sub-circuit 110—is used to provide a second sense current scaling factor "B." A second bank of digital control lines 160 (SEL104, SEL105, and SEL106) enable and disable a plurality of current branches (120b, 120c, and 120d, respectively) within the second stage of the programmable current mirror sub-circuit 120. As with the first programmable current mirror sub-circuit 110, enabling more than one of these current branches (120b, 120c, and 120d) introduces an effective gate aspect ratio mismatch between the first stage (comprised of Q113 and Q114) and the second stage of the programmable current mirror sub-circuit 120. Such a gate aspect ratio mismatch effectively provides a second scale factor (denoted as "B" in the schematic of FIG. 1) through programmable current mirror sub-circuit 120. FIG. 2B provides a table of nominal values of this scale factor ("B") for a plurality of control line 160 settings.

The first branch of second programmable current mirror sub-circuit 120 (including FETs Q113 and Q114) is electrically coupled to a resistive memory cell under test 140 through output node 180. If the resistive state stored within memory cell 140 is low enough to provide a sufficient path to ground, the second programmable current mirror sub-circuit 120 will be enabled. The second programmable current mirror sub-circuit 120 will then provide a second scaled version of the "base" current $I_1$ to the memory cell under test 140. The second scaled version of the base current is denoted in FIG. 1 as $I_3$ and is substantially equal to a current value of "(IREF*A)/B".

That is, if the applied sense current $I_3$ is sufficient to sense a low resistive state stored within the memory cell under test 140, the second programmable current mirror sub-circuit 120 will allow intermediate sense current $I_2$ to flow through Q112. Logic circuit U101 (depicted as a buffer in FIG. 1) is used to provide a digital output 190 indicative of the condition of this current. That is, the digital output 190 indicates whether a current is flowing or not flowing through the memory cell under test. This digital output can then be readily stored and used to record the success or failure of a read operation using the applied sense current $I_3$.

FIG. 2C provides a table of configuration settings (that is, scale factor selections responsive to the first and second banks of control signals 150 and 160, respectively) which can be used to apply various sense currents ($I_3$) to the memory cell under test 140. It should be noted that according to the methods of the present disclosure each of the configuration settings—and, by extension, each of the memory cell currents $I_3$—can be realized dynamically through manipulation of the first and second banks of control signals 150 and 160, respectively. That is, a plurality of sense currents ($I_3$) can be applied to the memory cell under test 140 without the need to switch in multiple current supplies or physically adjust the test circuit in any way. In this way, a plurality of sense currents can be used to read the state of memory cell 140 in rapid succession and the result of each read operation can be stored as a digital bit of data.

Figure 3:
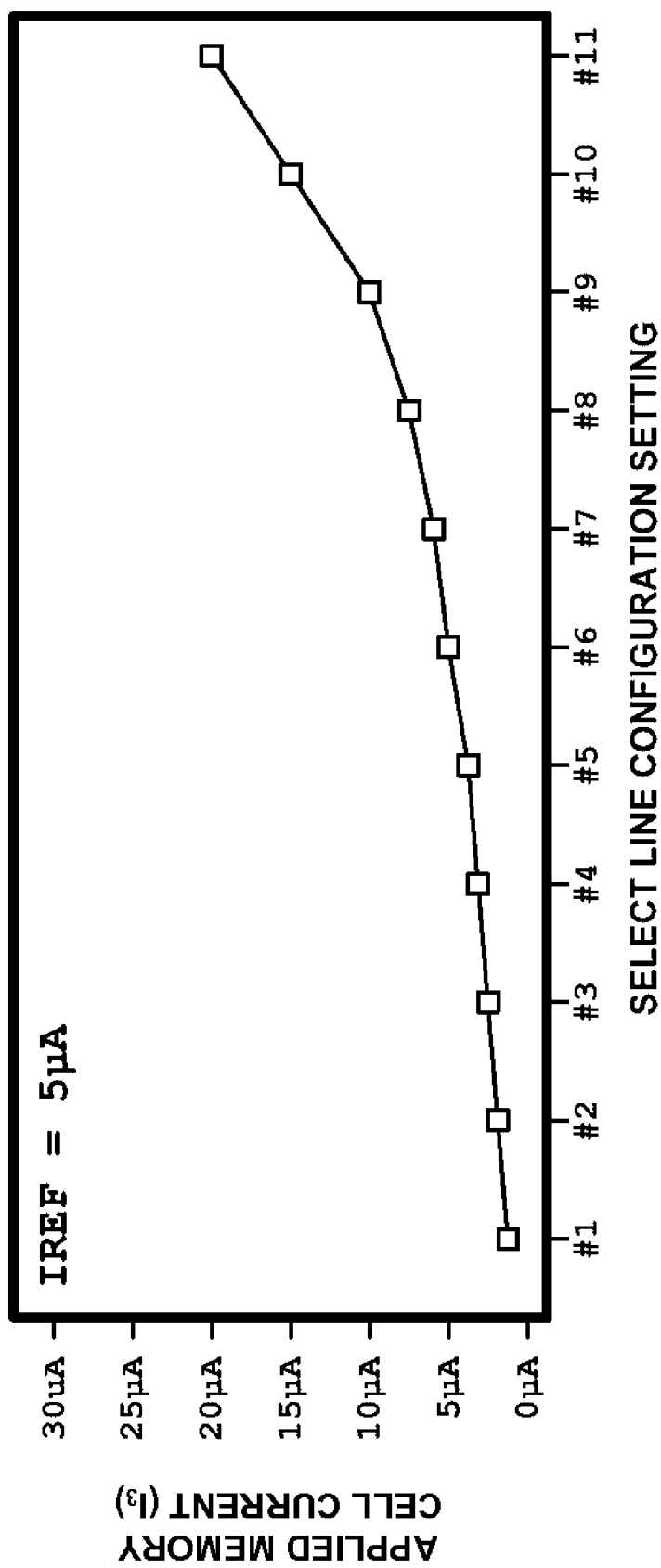
FIG. 3 is a plot graphically illustrating the range of sense currents available to the circuit of FIG. 1 using a base reference current of 5 μA, according to one or more embodiments of the present disclosure.

FIG. 3 is a plot of exemplary sense current values available to the dynamic sense current supply circuit depicted in FIG. 1 wherein $I_1$ ("IREF") has been set to 5 μA. However, other IREF values may be used. The numbered "configuration settings" plotted on the horizontal axis correspond to the configuration settings listed in the table depicted in FIG. 2C. The plot illustrates how the applied memory cell current $I_3$ can be incrementally increased (or alternately, decreased) for precise testing of the nonvolatile resistive memory cell.

Figure 4:
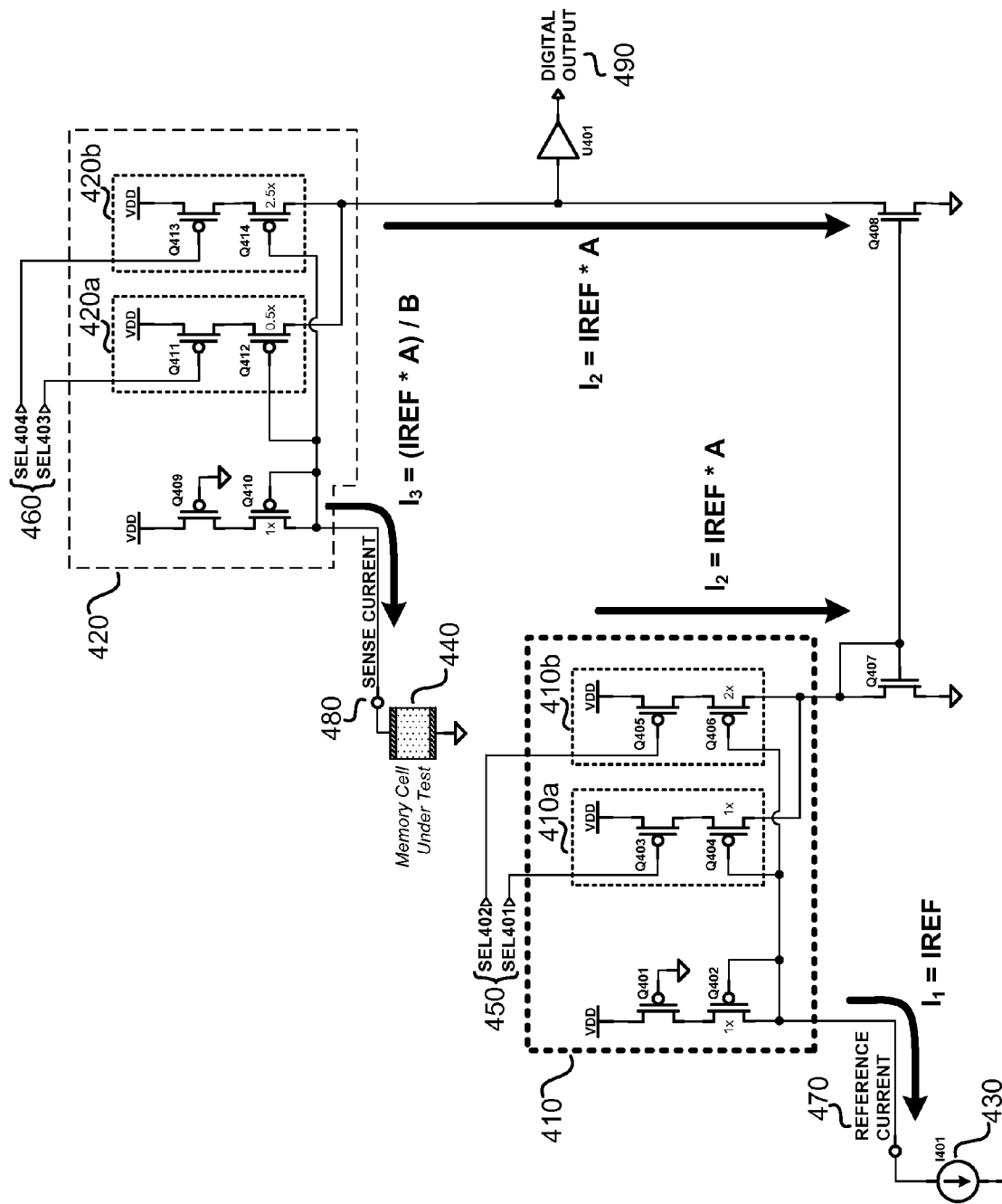
FIG. 4 is a simplified schematic depicting a dynamic sense current supply circuit, according to one or more embodiments of the present disclosure.

FIG. 4 is a simplified schematic diagram illustrating another embodiment of the dynamic sense current supply circuit of the present disclosure. Like the embodiment depicted in FIG. 1, the embodiment depicted in FIG. 4 is composed of two programmable current mirror sub-circuits 410 and 420. Unlike the embodiment of FIG. 1—where the gate aspect ratios of all the main FETs within the individual branches of each programmable current mirror sub-circuit were substantially equal—the gate aspect ratios of the main FETs within the schematic depicted in FIG. 4 are unequal. The gate aspect ratios of the main FETs (Q404 and Q406 within the first programmable current mirror sub-circuit 410, and Q412 and Q414 within the second programmable current mirror sub-circuit 420) are selected to provide a desired range of current scaling factors through both current mirror sub-circuits (410 and 420, respectively) using a limited number of branches (410*a* and 410*b* in the first current mirror sub-circuit 410, and 420*a* and 420*b* in the second current mirror sub-circuit 420). In this way, the current scaling factors can be adjusted to provide the appropriate sense signals for any range of memory cells under test.

FIG. 5A provides a table of nominal values available for the first scale factor ("A") for the circuitry depicted in FIG. 4 for a plurality of control line 450 settings (SEL401 and SEL402). Similarly, FIG. 5B provides a table of nominal values available for the second scale factor ("B") for the circuitry depicted in FIG. 4 for a plurality of control line 460 settings (SEL403 and SEL404). These scale factor values are used to implement the different configuration settings depicted in the table of FIG. 5C.

Referring to FIG. 5C—and comparing it to FIG. 2C—it can be seen that a comparable range of memory cell currents ($I_3$) is available within the alternate embodiment of the present disclosure (as depicted within the simplified schematic diagram of FIG. 4) as compared to the previous embodiment (as depicted with the schematic diagram of FIG. 1). That is, by carefully selecting differing gate area ratios within the current branches (410*a*, 410*b*, 420*a*, and 420*b*) a range of desired sense current can be realized with fewer branches (four total branches within the alternate embodiment compared to eight total in the previous embodiment).

Figure 6:
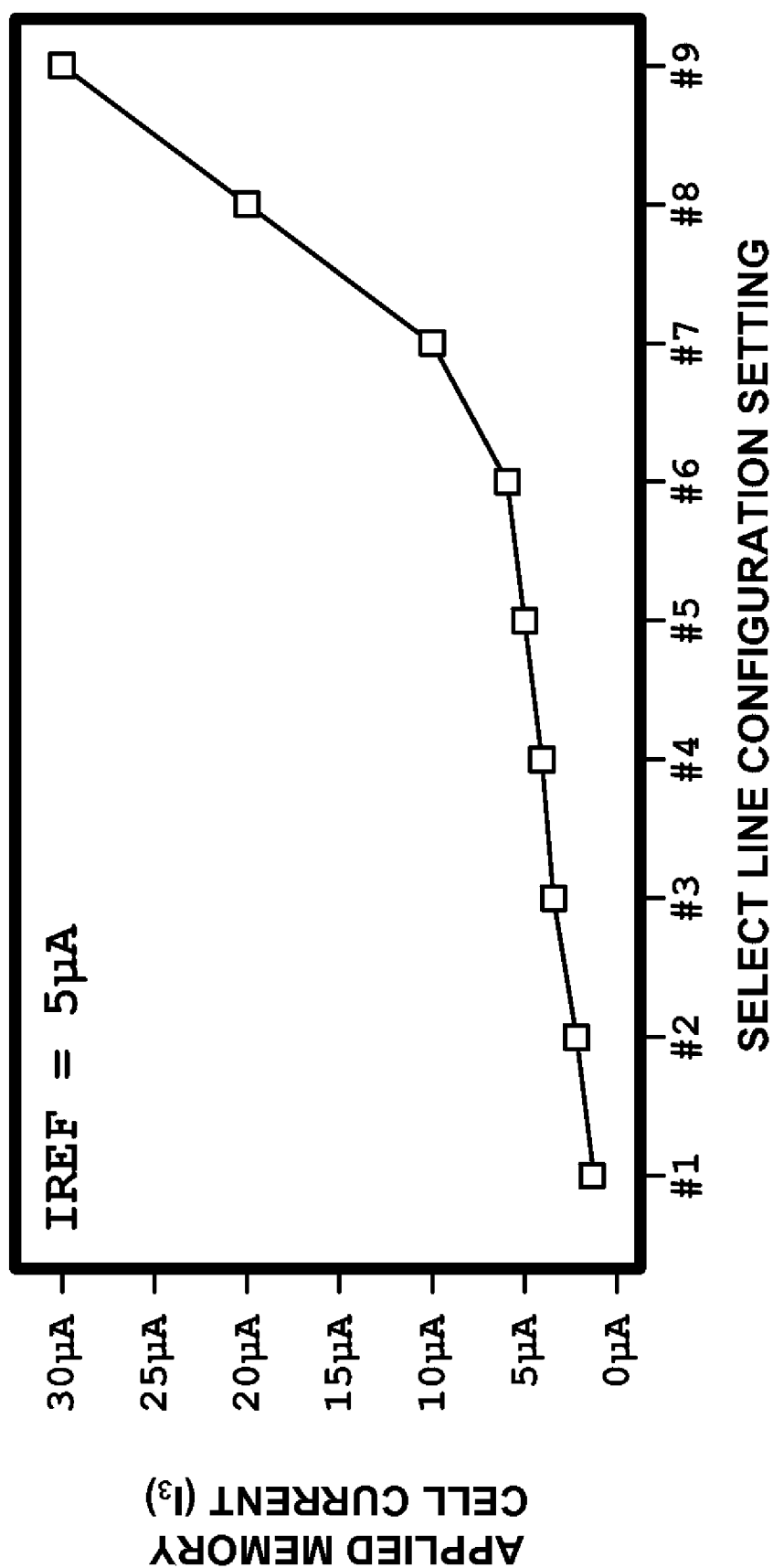
FIG. 6 is a plot graphically illustrating the sense currents available to the circuit of FIG. 4 using a base reference current of 5 μA, according to one or more embodiments of the present disclosure.

Similarly, FIG. 6 is a plot of exemplary sense current values available to the alternate embodiment of the dynamic sense current supply circuit depicted in FIG. 4 wherein $I_1$ ("IREF") has been assumed to be set to 5 μA. However, other IREF values may be used. The numbered "configuration settings" plotted on the horizontal axis correspond to the configuration settings listed in the table depicted in FIG. 5C. Comparing the plot of exemplary sense current values in FIG. 6 to those plotted in FIG. 3, it can be seen that a comparable range of sense current values is available to both the previous and alternate embodiments of the present disclosure.

It should be noted that while the previous and alternate embodiments of the present disclosure (as depicted in FIG. 1 and FIG. 4, respectively) achieve substantially the same range of dynamically generated sense currents, the previous embodiment is achieved with a simpler manufacturing process (a plurality of FETs all substantially matched) while the alternate embodiment is achieved with a significantly smaller circuit. As such, the methods of the present disclosure are not limited in this regard, and it is left to the needs of the specific application wherein the dynamic sense current supply circuit of the present disclosure is used to determine which embodiment is optimum.

It should also be noted that while FIG. 1 and FIG. 4 illustrate specific circuit arrangements, the methods of the present disclosure are not limited in this regard. The simplified schematic diagrams depicted in FIG. 1 and FIG. 4 have been rendered to describe the circuit architecture of the previous and alternate embodiments of the present disclosure, respectively, in clear and straightforward terms. Indeed, it will be known to those skilled in the art, that such an architecture can be realized within a plurality of substantially similar circuits, including circuits with additional features not specific to the methods of the present disclosure. The additional features may include, but are not limited to, current limiting circuits and devices, ESD protection circuits, and digital signal processing elements. Further, although FIG. 1 and FIG. 2 depict programmable current mirror sub-circuits comprised exclusively of pFETs, the methods of the present disclosure are not limited in this regard. Indeed, it will be known to those skilled in the art that such circuits can be similarly constructed using nFETs. It is preferred, therefore, that the methods of the present disclosure are not limited to the specific circuits used to effectively illustrate said methods.

It should be further noted that while the two embodiments of the present disclosure (as depicted in the simplified schematic diagrams of FIG. 1 and FIG. 4, respectively) each include exactly two programmable current mirror sub-circuits, the methods of the present disclosure are not limited in this regard. Indeed, it should be clear to those skilled in the art that the methods of the present disclosure as described in the detailed discussion of FIG. 1 and FIG. 4 above can be expanded to include additional programmable current mirror sub-circuits, with said additional circuits providing additional scaling factors.

Figure 7:
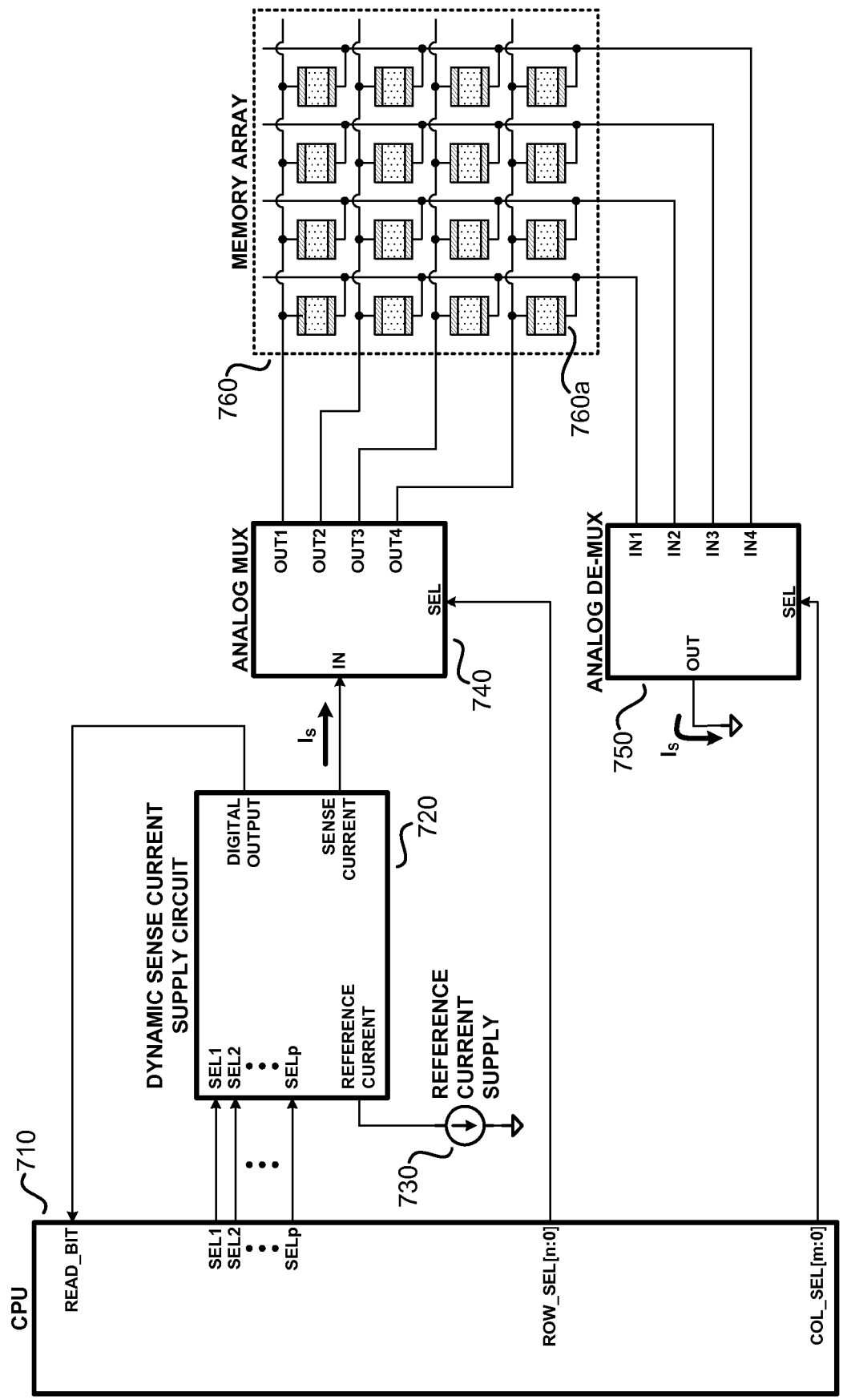
FIG. 7 is a functional block diagram of a memory array characterization system using the circuit and methods of the present disclosure.

FIG. 7 is a block diagram depicting a test system which makes use of the dynamic sense current supply circuit of the present disclosure. A CPU element 710 provides a first bank of digital control signals (SEL0-SELp) to the Dynamic Sense Current Supply Circuit 720. Responsive to said first set of control signals, the Dynamic Sense Current Supply Circuit 720 provides a sense current $I_S$ (a scaled version of the current supplied by the Reference Current Supply 730, provided according to the methods of the present disclosure) to the input of Analog MUX 740. It should be noted that the structure and function of the Dynamic Sense Current Supply Circuit 720 are detailed in FIGS. 1 and 4 and described in detail in the description of those figures above.

Responsive to a second bank of control signals provided by the CPU element 710 (ROW_SEL[n:0]), the Analog MUX 740 provides sense current $I_S$ to one row of Memory Array 760. Responsive to a third bank of control signals provided by the CPU element 710 (COL_SEL[m:0]), Analog DE-MUX 750 electrically couples one column of Memory Array 760 to ground. In this way, exactly one element 760a (that is, one memory cell) of Memory Array 760 will be responsive to the supplied sense current $I_S$. The Dynamic Sense Current Supply Circuit 720 further provides a digital output to the CPU element 710 indicative of the state of the memory cell selected by the Analog MUX 740 and Analog DE-MUX 750. In this way, a program or test sequence contained within CPU element 710 can perform a read operation on a plurality of memory cells 760a contained within Memory Array 760 with a plurality of dynamically generated sense currents, and the result of each read operation can be provided back to said CPU element 710 for storage, datalogging, or analysis.

Figure 8:
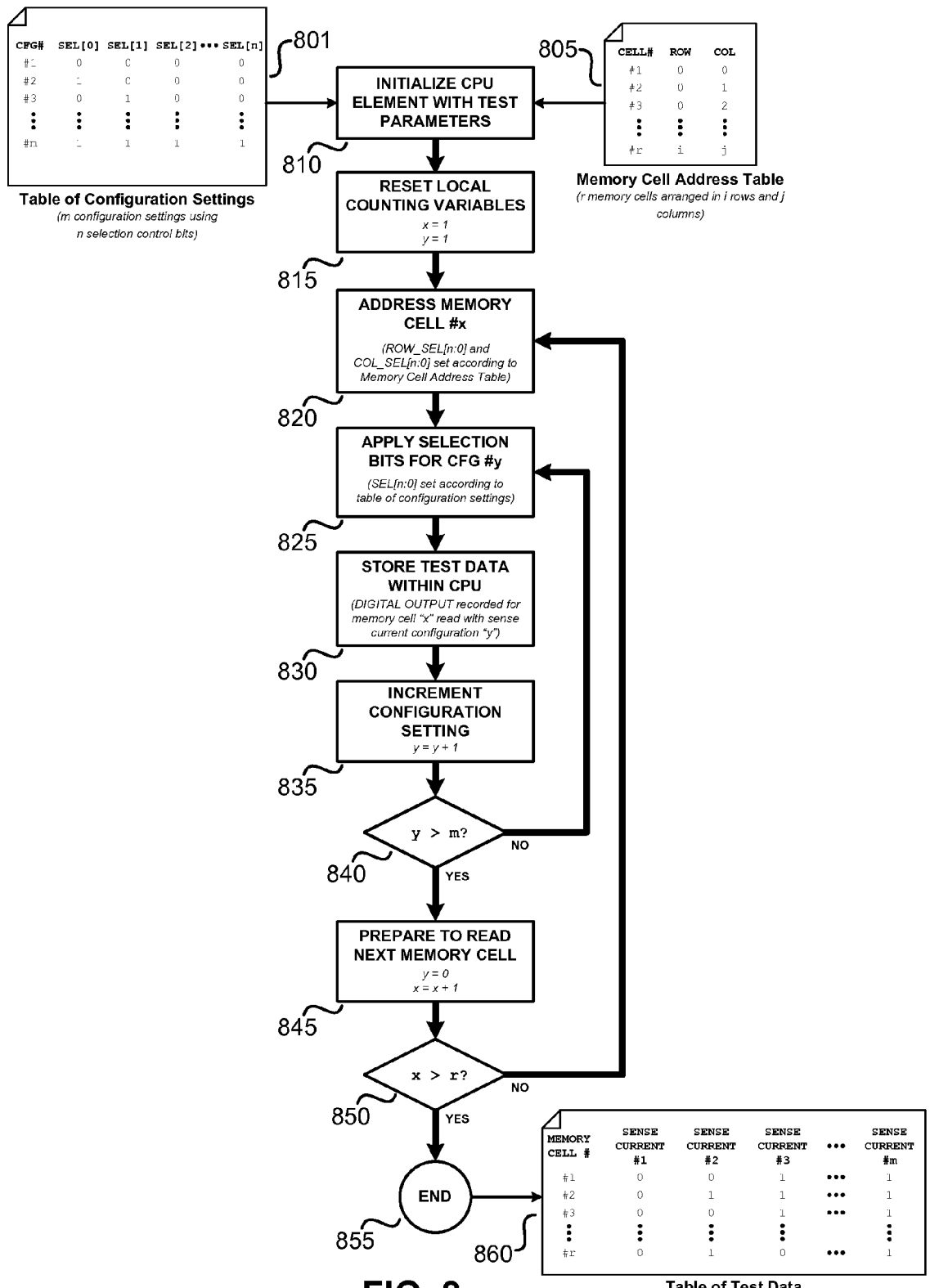
FIG. 8 is a flow chart detailing a memory array characterization operation using the methods of the present disclosure.

FIG. 8 is a flow chart depicting a typical memory array characterization operation which makes use of the dynamic sense current supply circuit of the present disclosure. For simplicity and clarity of explanation, it is assumed that said operation is performed using a test system substantially similar to the system depicted in FIG. 7 and described in detail above. It should be noted, however, that the methods of the present disclosure are not limited to such a test system or to the specific operation detailed in FIG. 8. Indeed, said test system and said operation are intended only to provide a non-limiting and illustrative example of the methods of the present disclosure.

In a first process step 810, the CPU element (corresponding to the CPU element 710 within the block diagram of FIG. 7) is loaded with a table of configuration settings 801 and a table of memory cell addresses 805. The table of configuration settings 801 provides the control settings (corresponding to control lines SEL[p:0]) required to dynamically generate each of the sense currents which will be used in the characterization operation. Similarly, the table of memory cell addresses 805 provides the row and column addresses (corresponding to the control lines ROW_SEL[n:0] and COL_SEL[m:0], respectively) required to address each of the elements (memory cells) within the memory array under test.

In a next process step 815, two counting variables ("x" and "y") are both set to a value of one. Counting variable "x" is used to identify the specific memory cell under test at each point in the characterization operation and to access the necessary row and column information from the memory cell address table 805. Counting variable "y" is used to identify the sense current being used at each point in the characterization operation and to access the necessary configuration settings required to realize each sense current from the table of configuration settings 801.

In a next process step 820, memory cell "x" is addressed (according to the row and column information stored within the memory cell address table 805). In a next process step 825, the selection bits for configuration "y" are used to generate a sense current with the dynamic sense current supply circuit of the present disclosure (720 in FIG. 7). In a next process step 830, the digital output of the dynamic sense current supply circuit of the present disclosure (720 in FIG. 7) is stored within the CPU element (710 in FIG. 7) along with the current value of "x" (indicating which memory cell is being tested) and the current value of "y" (indicating the value of the sense current being applied). In a next process step 835, the value of "y" is incremented such that the next sense current (according to the table of configuration settings 801) can be dynamically generated.

In a next processing step 840, the operation performs a check to see if the value stored in the counting variable "y" exceeds the number of configuration settings listed within the table of configuration settings 801. If the check reports a false condition (that is, if the value stored within the counting variable "y" corresponds to a valid configuration setting), the operation returns back to process step 825, and the next sense current is dynamically generated and applied to memory cell "x." If the check reports a true condition (that is, if the value stored within the counting variable "y" does not correspond to a valid configuration setting, indicating that memory cell "x" has been tested with the entire list of sense currents), then the counting variable "x" is incremented by one (advancing the operation to characterize the next memory cell in the table of memory cell addresses 805) and the counting variable "y" is reset to one within processing step 845.

In a next processing step 850, the operation performs a check to see if the value stored in the counting variable "x" exceeds the number of memory cells listed in the table of memory cell addresses 805. If the check reports a false condition (that is, if the valued stored within the counting variable "x" corresponds to a valid memory cell), the operation returns back to process step 820, and the next memory cell is characterized. If the check reports a true condition (that is, if all the memory cells listed in the table of memory cell addresses 805 have been characterized), the operation completes. In this way, each cell is measured for each configuration setting.

At the conclusion of the characterization operation, a table of test data 860 is provided, listing the result of each read operation. In this way, the success or failure of each sense current is documented for each memory cell (760a in FIG. 7) within the memory array under test (760 in FIG. 7) and a full and precise characterization of said memory array (760 in FIG. 7) with respect to sense current is realized.

In some applications, most notably—but not limited to—those including an array of resistive memory cells (104 in FIG. 1, 404 in FIG. 4) wherein said memory cells store data within more than two resistive states, the dynamic sense current supply circuit can be useful for rapidly and reliably determining the state of—or data value stored within—a memory cell within a normal read operation. As described in detail within the discussions of FIG. 1 and FIG. 4, the digital output signal (190 in FIG. 1, 490 in FIG. 2) provides an indication of the responsiveness of a memory cell under test (104 in FIG. 1, 404 in FIG. 4) to an applied sense current. As such, the resistive state stored within a memory cell under test (104 in FIG. 1, 404 in FIG. 4) can be determined by applying a series of test currents and analyzing the results of the digital output signal (190 in FIG. 1, 490 in FIG. 2). That is, the resistive state of a memory cell will be indicated by determining to which sense currents said memory cell is responsive. In this way, more than two resistive states can be rapidly and reliably read from a resistive memory cell using the methods of the present disclosure.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. An electronic circuit for characterizing a resistive memory array, said circuit comprising:
    a first current mirror sub-circuit, said first current mirror sub-circuit comprising a first stage and a second stage, said second stage comprising at least two current branches and wherein at least one of said current branches is responsive to an enable control;
    a second current mirror sub-circuit, said second current mirror sub-circuit comprising a first stage and a second stage, said second stage comprising at least two current branches and wherein at least one of said current branches is responsive to an enable control;
    a reference current terminal to apply an external reference current to said first current mirror sub-circuit to generate a first current through said first current mirror sub-circuit;
    an interconnection to couple said first current to said second current mirror sub-circuit;
    a sense current terminal to apply a sense current passed through said second current mirror sub-circuit to a memory cell under test; and
    a digital circuit element to generate a digital signal indicative of electrical current flowing through said memory cell under test.

2. The circuit of claim 1 wherein at least one of the first and second current mirror sub-circuits are substantially comprised of field effect transistors, each of said field effect transistors having a gate area ratio.

3. The circuit of claim 2, wherein each field effect transistor has the same gate area ratio.

4. The circuit of claim 2, wherein at least one field effect transistor has a different gate area ratio.

5. The circuit of claim 2, wherein each field effect transistor has a different gate area ratio.

6. The circuit of claim 1, wherein said second stage of each of said first current mirror sub-circuit and said second current mirror sub-circuit comprises three current branches.

7. The circuit of claim 2 wherein said gate area ratios within said field effect transistors comprising at least one of said first and second current mirror sub-circuits are selected to provide a desired current scaling factor through at least one of said first and second current mirror sub-circuits.

8. The circuit of claim 1 wherein at least one of said first and second current mirror sub-circuits provides at least one programmable current scaling factor through at least one of said first and second current mirror sub-circuits.

9. The circuit of claim 8 wherein the at least one programmable current scaling factor is responsive to at least one digital enable control signal.

10. The circuit of claim 1 wherein said interconnection is a current mirror circuit.

11. The circuit of claim 1 wherein said digital circuit element is comprised of at least one digital logic gate.

12. The circuit of claim 11 wherein said digital circuit element is comprised of at least one inverter.

13. The circuit of claim 1 further comprising at least one additional current mirror sub-circuit.

14. The circuit of claim 13, wherein said at least one additional current mirror sub-circuit provides at least one additional current scale factor.

* * * * *